US 6,707,078 B1

(12) United States Patent
Shiraiwa et al.

(10) Patent No.: US 6,707,078 B1
(45) Date of Patent: Mar. 16, 2004

(54) DUMMY WORDLINE FOR ERASE AND BITLINE LEAKAGE

(75) Inventors: Hidehiko Shiraiwa, San Jose, CA (US); Yider Wu, San Jose, CA (US); Jean Yee-Mei Yang, Sunnyvale, CA (US); Mark T. Ramsbey, Sunnyvale, CA (US); Darlene G. Hamilton, San Jose, CA (US)

(73) Assignee: Fasl, LLC, Sunnyvale, CA (US)

( * ) Notice: Subject to any disclaimer, the term of this patent is extended or adjusted under 35 U.S.C. 154(b) by 13 days.

(21) Appl. No.: 10/230,729

(22) Filed: Aug. 29, 2002

(51) Int. Cl.⁷ .............................. H01L 29/68; G11C 5/06
(52) U.S. Cl. ..................... 257/208; 257/324; 257/326; 365/185.2; 365/210
(58) Field of Search .................................. 257/208, 209, 257/324, 325, 326; 365/185.2, 210

(56) References Cited

U.S. PATENT DOCUMENTS

| 4,173,766 A | 11/1979 | Hayes ........................... 357/23 |
| 5,168,334 A | 12/1992 | Mitchell et al. ............ 257/324 |
| 5,349,221 A | 9/1994 | Shimoji ....................... 257/324 |
| 5,644,533 A | 7/1997 | Lancaster et al. ...... 365/185.18 |
| 5,768,192 A | 6/1998 | Eitan ..................... 365/185.24 |
| 5,825,686 A | 10/1998 | Schmitt-Landsiedel et al. .. 365/185.03 |
| 5,963,465 A | 10/1999 | Eitan ............................ 365/63 |
| 5,966,603 A | 10/1999 | Eitan ............................ 438/258 |
| 6,001,709 A | 12/1999 | Chuang et al. .............. 438/440 |
| 6,011,725 A | 1/2000 | Eitan ..................... 365/185.35 |
| 6,030,871 A | 2/2000 | Eitan ............................ 438/276 |

FOREIGN PATENT DOCUMENTS

WO WO9960631 5/1999 ......... H01L/29/792

OTHER PUBLICATIONS

"A True Single–Transistor Oxide–Nitride–Oxide EEPROM Device," T. Y. Chan, et al., IEEE Electron Device Letters, vol. EDL 8, No. 3, Mar. 1987.
"An Electrically Alterable Nonvolatile Memory Cell Using a Floating–Gate Structure," Daniel C. Guterman, et al., IEEE Transactions on Electron Devices, vol. ED–26, No. 4, Apr. 1979.
"NROM: A Novel Localized Trapping, 2–Bit Nonvolatile Memory Cell," Boaz Eitan, et al., IEEE Electron Device Letters, vol. 21, No. 11 Nov. 2000.

*Primary Examiner*—Minhloan Tran
(74) *Attorney, Agent, or Firm*—Amin & Turocy, LLP

(57) ABSTRACT

One aspect of the present invention relates to a SONOS type non-volatile semiconductor memory device having improved erase speed, the device containing bitlines extending in a first direction; wordlines extending in a second direction, the wordlines comprising functioning wordlines and at least one dummy wordline, wherein the dummy wordline is positioned near at least one of a bitline contact and an edge of the core region, and the dummy wordline is treated so as not to cycle between on and off states. Another aspect of the present invention relates to a method of making a SONOS type non-volatile semiconductor memory device having improved erase speed, involving forming a plurality of bitlines extending in a first direction in the core region; forming a plurality of functioning wordlines extending in a second direction in the core region; forming at least one dummy wordline between the functioning wordlines and the periphery region or between the functioning wordlines and a bitline contact and treating the device so that the dummy wordline does not cycle between on and off states.

20 Claims, 6 Drawing Sheets

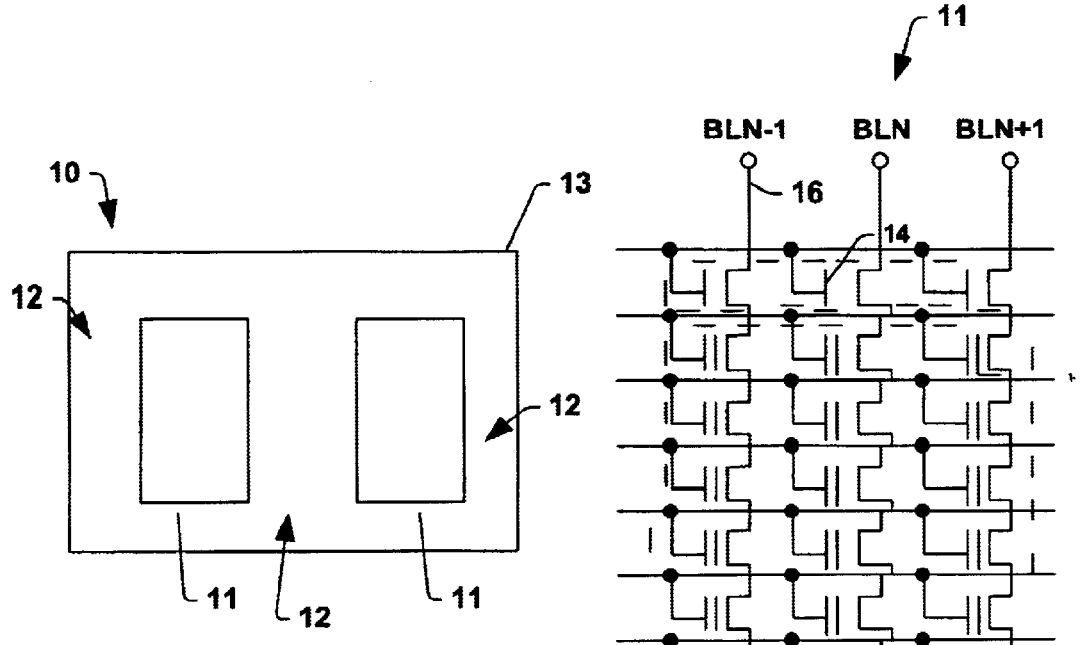
FIG. 1
FIG. 2
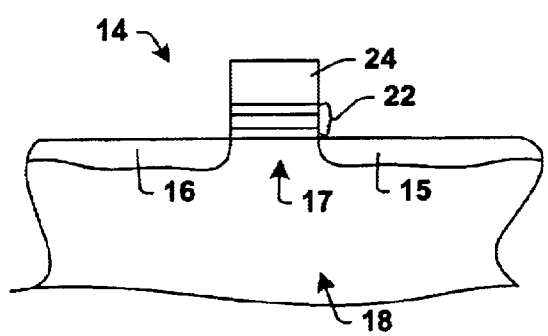
FIG. 3

DUMMY WORDLINE FOR ERASE AND BITLINE LEAKAGE

TECHNICAL FIELD

The present invention generally relates to a non-volatile semiconductor memory device and non-volatile semiconductor memory devices having improved erase speed and/or less bit line leakage, and methods of forming such memory devices.

BACKGROUND ART

Conventional floating gate flash memory types of EEPROMs (electrically erasable programmable read only memory), employ a memory cell characterized by a vertical stack of a tunnel oxide, a first polysilicon layer over the tunnel oxide, an ONO (oxide-nitride-oxide) interlevel dielectric over the first polysilicon layer, and a second polysilicon layer over the ONO interlevel dielectric. For example, Guterman et al (IEEE Transactions on Electron Devices, Vol. 26, No. 4, p. 576, 1979) relates to a floating gate nonvolatile memory cell consisting of a floating gate sandwiched between a gate oxide and an interlevel oxide, with a control gate over the interlevel oxide.

Generally speaking, a flash memory cell is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control electrode to create an electron attracting field and applying a positive voltage of moderate magnitude to the drain region in order to generate "hot" (high energy) electrons. After sufficient negative charge accumulates on the floating gate, the negative potential of the floating gate raises the threshold voltage of its field effect transistor (FET) and inhibits current flow through the channel region through a subsequent "read" mode. The magnitude of the read current is used to determine whether or not a flash memory cell is programmed.

The act of discharging the floating gate of a flash memory cell is called the erase function. The erase function is typically carried out by a Fowler-Nordheim tunneling mechanism between the floating gate and the source region of the transistor (source erase or negative gate erase) or between the floating gate and the substrate (channel erase). A source erase operation is induced by applying a high positive voltage to the source region and a 0 V to the control gate and the substrate while floating the drain of the respective memory cell.

Subsequently, SONOS (Silicon Oxide Nitride Oxide Silicon) type memory devices have been introduced. See Chan et al, IEEE Electron Device Letters, Vol. 8, No. 3, p. 93, 1987. SONOS type flash memory cells are constructed having a charge trapping non-conducting dielectric layer, typically a silicon nitride layer, sandwiched between two silicon dioxide layers (insulating layers). The nonconducting dielectric layer functions as an electrical charge trapping medium. A conducting gate layer is placed over the upper silicon dioxide layer. Since the electrical charge is trapped locally near whichever side that is used as the drain, this structure can be described as a two-transistor cell, or two-bits per cell. If multi-level is used, then four or more bits per cell can be accomplished. Multi-bit cells enable SONOS type memory devices to have the advantage over others in facilitating the continuing trend increasing the amount of information held/processed on an integrated circuit chip.

For simplicity, a two-bit per cell implementation of SONOS is described. While both bits of SONOS type memory devices are programmed in a conventional manner, such as using hot electron programming, each bit is read in a direction opposite that in which it is programmed with a relatively low gate voltage. For example, the right bit is programmed conventionally by applying programming voltages to the gate and the drain while the source is grounded or at a lower voltage. Hot electrons are accelerated sufficiently so that they are injected into a region of the trapping dielectric layer near the drain. The device, however, is read in the opposite direction from which it is written, meaning voltages are applied to the gate and the source while the drain is grounded or at a lower voltage. The left bit is similarly programmed and read by swapping the functionality of source and drain terminals. Programming one of the bits leaves the other bit with its information intact and undisturbed. Programming one of the bits may have a very small effect on the other bit.

Reading in the reverse direction is most effective when relatively low gate voltages are used. A benefit of utilizing relatively low gate voltages in combination with reading in the reverse direction is that the potential drop across the portion of the channel beneath the trapped charge region is significantly reduced. A relatively small programming region or charge trapping region is possible due to the lower channel potential drop under the charge trapping region. This permits much faster programming times because the effect of the charge trapped in the localized trapping region is amplified. Programming times are reduced while the delta in threshold voltage between the programmed versus unprogrammed states remains the same as when the device is read in the forward direction.

SONOS type memory devices offer additional advantages as well. In particular, the erase mechanism of the memory cell is greatly enhanced. Both bits of the memory cell can be erased by applying suitable erase voltages to the gate and the drain for the right bit and to the gate and the source for the left bit. Another advantage includes reduced wearout from cycling thus increasing device longevity. An effect of reading in the reverse direction is that a much higher threshold voltage for the same amount of programming is possible. Thus, to achieve a sufficient delta in the threshold voltage between the programmed and unprogrammed states of the memory cell, a much smaller region of trapped charge is required when the cell is read in the reverse direction than when the cell is read in the forward direction.

The erase mechanism is enhanced when the charge trapping region is made as narrow as possible. Programming in the forward direction and reading in the reverse direction permits limiting the width of the charge trapping region to a narrow region near the drain (right bit) or the source. This allows for much more efficient erasing of the memory cell.

Another advantage of localized charge trapping is that during erase, the region of the nitride away from the drain does not experience deep depletion since the erase occurs near the drain only. The final threshold of the cell after erasing is self limited by the device structure itself. This is in direct contrast to conventional single transistor floating gate flash memory cells which often have deep depletion problems.

Although many advantages are described above, there are at least two disadvantages associated with SONOS type memory devices. One disadvantage is that slow and/or non-uniform erase times are exhibited by certain memory cells. In some instances, a build-up of charges in or near the floating gate of some of the memory cells in an array after cycling undesirably causes an increase in erase time for these particular memory cells. Moreover, memory cells having gates with different widths have different erase speeds. In this connection, gate transistors with relatively wide widths generally have slower erase speeds.

One characteristic of a SONOS type non-volatile memory devices is erase speed. There is an unmet need for SONOS type non-volatile memory devices that exhibit fast erase times as well as uniform erase times across an array. Fast and uniform erase times facilitate reliability and the processing of increased amounts of information in a set period of time.

Another disadvantage with SONOS type memory devices is bit line leakage. While bit line leakage may occur anywhere within an array of memory cells, it is especially likely to occur at the tip or end of the bitlines and/or near contacts. Thermal cycling associated with LOCOS (LOCal Oxidation of Silicon) formation may cause an increase in bitline to bitline punch-through leakage. That is, implant diffusion caused by thermal cycling may lead to undesirable leakage between bitlines. There is an unmet need for SONOS type non-volatile memory devices that exhibit less bitline leakage.

SUMMARY OF THE INVENTION

The present invention provides SONOS type non-volatile semiconductor memory devices characterized by improved erase times and less bitline leakage. The SONOS type non-volatile semiconductor memory devices of the present invention have at least one dummy wordline positioned near the edge of a memory cell array and/or near one or more bitline contacts within the memory cell array. Improved erase times means that at least one of faster erase times and erase times of increased uniformity for all memory cells with an array.

One aspect of the present invention relates to a SONOS type non-volatile semiconductor memory device, containing a silicon substrate comprising a core region and periphery region, the core region comprising a plurality of memory cells and bitlines extending in a first direction; each of the plurality of memory cells comprising a charge trapping layer over the silicon substrate, and a polysilicon layer over the charge trapping layer; wordlines extending in a second direction, the wordlines comprising functioning wordlines and at least one dummy wordline, wherein the dummy wordline is positioned near at least one of a bitline contact and an edge of the core region, and the dummy wordline is treated so as not to cycle between on and off states.

Another aspect of the present invention relates to a SONOS type non-volatile semiconductor memory cell having improved erase speed, containing a silicon substrate comprising a core region and periphery region, the core region comprising at least one array of memory cells and the periphery region comprising input/output circuitry; each of the memory cells comprising a charge trapping layer over the silicon substrate, and a polysilicon layer over the charge trapping layer, the core region comprising a plurality of bitlines extending in a first direction; the core region comprising a plurality of wordlines extending in a second direction, the wordlines comprising functioning wordlines and at least one dummy wordline, wherein the dummy wordline is positioned between the functioning wordlines and the periphery region, and the dummy wordline is treated so as not to cycle between on and off states.

Yet another aspect of the present invention relates to a method of making a SONOS type non-volatile semiconductor memory device, involving providing a silicon substrate having a core region and a periphery region; forming at least one array of memory cells in the core region, the memory cells comprising a charge trapping layer over the silicon substrate, and a polysilicon layer over the charge trapping layer; forming a plurality of bitlines extending in a first direction in the core region; forming a plurality of functioning wordlines extending in a second direction in the core region; forming at least one dummy wordline between the functioning wordlines and the periphery region or between the functioning wordlines and a bitline contact and treating the device so that the dummy wordline does not cycle between on and off states.

Still yet another aspect of the present invention relates to a method of increasing erase speed in a SONOS type non-volatile memory device, involving providing a silicon substrate having a core region and a periphery region, the core region comprising at least one array of memory cells, the memory cells comprising an ONO charge trapping layer over the silicon substrate, and a polysilicon layer over the ONO charge trapping layer, a plurality of bitlines extending in a first direction, a plurality of functioning wordlines extending in a second direction; forming at least one dummy wordline between the functioning wordlines and the periphery region or between the functioning wordlines and a bitline contact and treating the device so that the dummy wordline does not cycle between on and off states.

BRIEF DESCRIPTION OF THE DRAWINGS

FIG. 1 illustrates a top down view of a SONOS type non-volatile semiconductor memory device according to one aspect of the present invention.

FIG. 2 illustrates a circuit diagram of a SONOS type non-volatile semiconductor memory device according to one aspect of the present invention.

FIG. 3 illustrates a cross sectional view of a SONOS type non-volatile semiconductor memory cell according to one aspect of the present invention.

DISCLOSURE OF THE INVENTION

Figure 4:
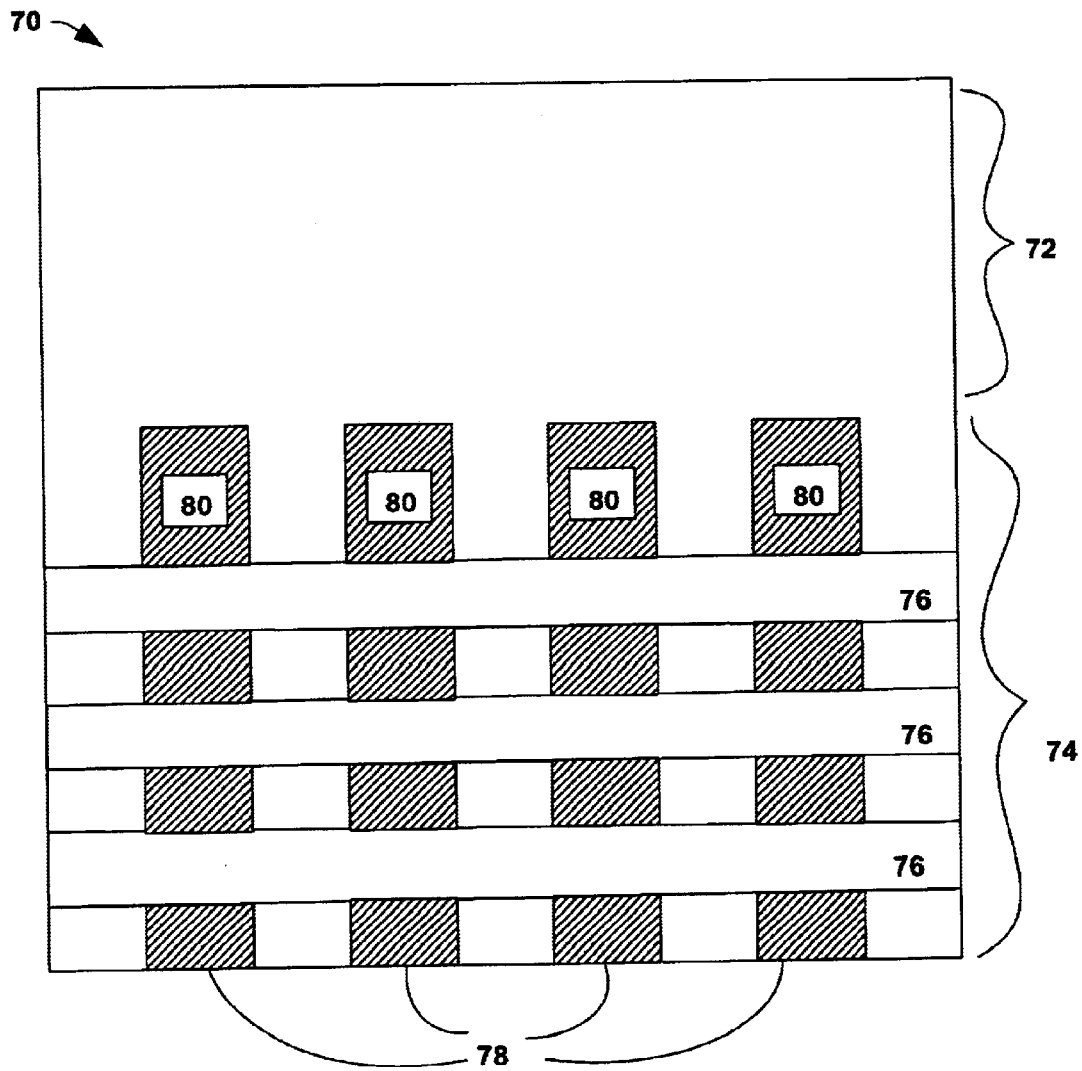
FIG. 4 illustrates a top down view of making a SONOS type non-volatile semiconductor memory cell in accordance with one aspect of the present invention.

The present invention involves improving erase times and/or bitline leakage for SONOS type non-volatile semiconductor memory devices by introducing at least one dummy wordline at the edge of an array and/or near bitline contacts. The dummy wordline can be floating or biased, such as grounding or having a negative bias. The dummy wordline (including the substrate surrounding the dummy wordline) may be treated to prevent it from cycling between "on" and "off" states. In this connection, treatment involves one selected from the group of a implanting a threshold implant into the silicon substrate near and/or below the dummy wordline, exposing dummy gate transistors to ultraviolet light to raise the threshold voltage, and programming the dummy gate transistors to remain in the on state.

While not wishing to be bound by any theory, it is believed that the presence of at least one dummy wordline treated in accordance with the present invention eliminates the occurrence of wide wordlines and increases wordline width uniformity (for the operable wordlines) thereby increasing erase speed and/or program and erase uniformity. Also while not wishing to be bound by any theory, it is believed that the presence of at least one dummy wordline treated in accordance with the present invention at the edge of an array that is biased mitigates high bitline leakage that typically occurs near the tip of the bitlines which are positioned near the edges of the array. The presence of at least one dummy wordline may additionally increase the erase speed over extensive program-erase cycles.

The present invention may be employed for SONOS type non-volatile semiconductor memory devices having a NOR or NAND type configuration. The present invention may also be implemented by any of ROMs (read only memories), PROMs (programable read only memories), EPROMs (erasable programable read only memories), and EEPROMs (electrically erasable programmable read only memories).

The present invention is now described in connection with FIGS. 1 to 7. Referring to FIG. 1, a SONOS type non-volatile semiconductor memory device such as a flash memory 10 comprises one or more high density core regions 11 and a low density periphery portion 12 on a single substrate 13. The high density core regions 11 contains at least one M x N array of individually addressable, substantially identical memory cells and the low density periphery portion 12 includes input/output (I/O) circuitry and circuitry for selectively addressing the individual cells (such as decoders for connecting the source, gate and drain of-selected cells to predetermined voltages or impedances to effect designated operations of the cell such as programming, reading or erasing). For example, controls/structures for the programming, reading, and erasing operations are formed and positioned in the periphery region 12.

Referring to FIG. 2, the memory cells within the core portion 11 are coupled together in a NAND-type circuit configuration. Each memory cell 14 has a drain 15, a source 16 and a stacked gate. A plurality of memory cells 14 connected together in series with a drain select transistor at one end and a source select transistor at the other end to form a NAND string as illustrated in FIG. 2. Each stacked gate is coupled to a word line (WL0, WL1, . . . , WLn) while each drain of the drain select transistors are coupled to a bit line (BL0, BL1, . . . , BLn). Lastly, each source of the source select transistors are coupled to a common source line Vss. Using peripheral decoder and control circuitry, each memory cell 14 can be addressed for programming, reading or erasing functions.

Referring to FIG. 3, a fragmentary cross section diagram of a SONOS type non-volatile semiconductor memory cell 14 in the core region 11 of FIGS. 1 and 2. Such a cell 14 may include the source 16, the drain 15 and a channel 17 in a substrate or P-well 18; and the stacked gate structure overlying the channel 17. The stacked gate optionally further includes a thin gate dielectric layer (not shown, but commonly referred to as the tunnel oxide) formed on the surface of the P-well 18. The stacked gate also includes a charge trapping dielectric layer 22 which overlies the optional tunnel oxide (or the surface of the P-well 18 when a tunnel oxide is not employed). The charge trapping dielectric layer 22 is often a multilayer structure, such as an oxide-nitride-oxide (ONO) layer having two oxide layers sandwiching a nitride layer. A polysilicon control gate 24 overlies the charge trapping dielectric layer 22. The control gates 24 of the respective cells 14 that are formed in a lateral row share a common word line (WL) associated with the row of cells (see, for example, FIG. 2). In addition, as highlighted above, the drain regions 15 of the respective cells in a vertical column are connected together by a conductive bit line (BL).

Although the charge trapping dielectric is shown as an ONO dieletric, it may be any dielectric layer or layers that are capable of or facilitate electron trapping. For example, charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanatebarium strontium titanate trilayer dielectric ($SiO_2/SrTiO_3/BaSrTiO_2$), an oxide/hafnium oxide/oxide trilayer dielectric, and the like (in each case, the first layer mentioned is the bottom layer while the last layer mentioned is the top layer).

Although the term SONOS type nonvolatile memory device is used herein, it is to be understood that a SONOS type nonvolatile memory device as used herein may contain any of the charge trapping dielectrics described above. In other words, a SONOS type nonvolatile memory device contains any dielectric layer or layers that are capable of or facilitate electron trapping, and the SONOS type nonvolatile memory device contains an ONO charge trapping dielectric only when a specific reference to such dielectric is indicated.

Moreover, in the embodiments where the charge trapping dielectric is an ONO dielectric, one or both of the silicon dioxide layers may be a silicon-rich silicon dioxide layer. One or both of the silicon dioxide layers may also be an oxygen-rich silicon dioxide layer. One or both of the silicon dioxide layers may be a thermally grown or a deposited oxide. One or both of the silicon dioxide layers may be nitrided oxide layers. The nitride layer may be a silicon-rich silicon nitride layer. The nitride layer may also be a nitrogen-rich silicon nitride layer.

Referring to FIG. 4, a top down view of a portion of a SONOS type nonvolatile memory device 70 is shown without and/or before a dummy wordline is formed near the edge of an array (near the edge of the core region 74) and/or near bitline contacts 80. The SONOS type nonvolatile memory device 70 has a periphery region 72 and a core region 74 (structure/circuitry not shown in the periphery region 72 for brevity). The core region 74 contains bitlines 78 and wordlines 76 positioned in perpendicular relation for addressing each memory cell.

Figure 5:
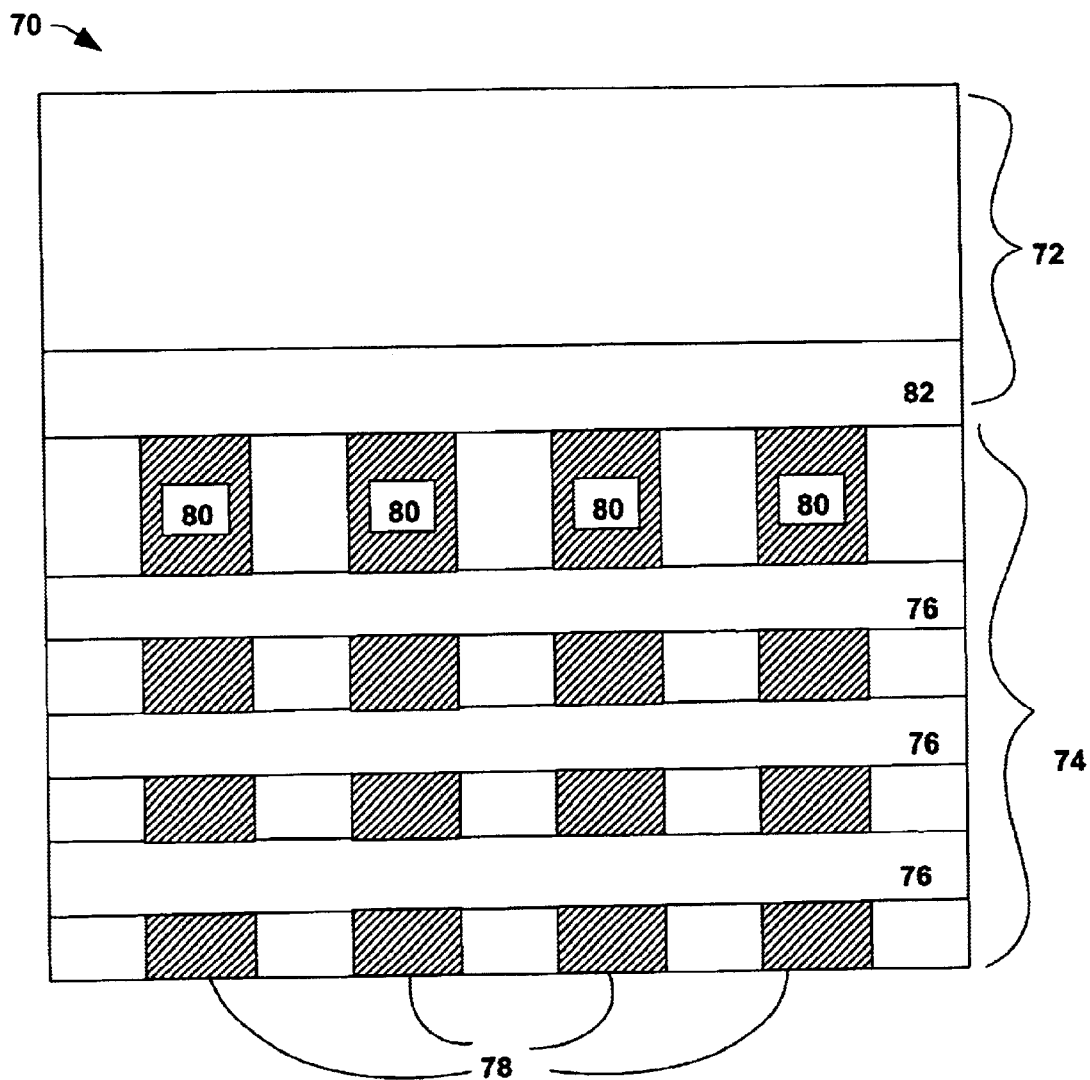
FIG. 5 illustrates a top down view of a portion of a SONOS type non-volatile semiconductor memory cell in accordance with one aspect of the present invention.

Referring to FIG. 5, another top down view of the portion of the SONOS type nonvolatile memory device 70 is shown with a dummy wordline 82 formed near the edge of an array (near the edge of the core region 74) and/or near bitline contacts 80. The dummy wordline 82 may be floating, biased, or grounded. The dummy wordline 82 is formed at the same time the functioning wordlines 76 are fabricated, before the functioning wordlines 76 are fabricated, or after the functioning wordlines 76 are fabricated.

A dummy wordline is near the edge of the core region (outer edge) when the dummy wordline is closest amongst all of the wordlines to the edges adjacent (parallel) the length of the array of wordlines. In other words, a dummy wordline is near the edge of the core region when the dummy wordline is positioned between the functioning wordlines and the periphery region. A wordline is near the bitline contact when it is next to the bitline contact without another wordline therebetween. Again, in other words, a dummy wordline is near the bitline contact when the dummy wordline is positioned between the functioning wordlines and the bit line contact.

Since the dummy wordline 82 does not function as a wordline, it is not critical that its width is the same or even substantially the same as the functioning wordlines 76, although the width can be the same or substantially the same. This is contrary to making the functioning wordlines 76, wherein it is desired to make all of the wordlines 76 with the same or at least substantially the same the width. In one embodiment, the dummy wordline 82 has a width larger than the width of the functioning wordlines 76.

In order to prevent or minimize the dummy wordline 82 from functioning as a wordline, one of the following treatments are employed. A threshold implant may be implanted into the silicon substrate near and/or below the dummy wordline to raise the threshold voltage. For example, boron can be implanted into areas of the substrate underlying and near the dummy wordline. Alternatively, the dummy gate transistors may be exposed to ultraviolet light to raise the threshold voltage. Again alternatively, the dummy gate transistors may be programmed to remain in the "on" state, thereby preventing or reducing cycling between "on" and "off" states.

In one embodiment, the width of the bitlines 78 is from about 0.10 $\mu$m to about 1.5 $\mu$m. In another embodiment, the width of the bitlines 78 is from about 0.15 $\mu$m to about 1 $\mu$m. In yet another embodiment, the width of the bitlines 78 is from about 0.2 $\mu$m to about 0.75 $\mu$m.

In one embodiment, the width of the wordlines 76 is from about 0.15 $\mu$m to about 0.8 $\mu$m and the width of the dummy wordline 82 is from about 0.15 $\mu$m to about 0.8 $\mu$m. In another embodiment, the width of the wordlines 76 is from about 0.2 $\mu$m to about 0.3 $\mu$m and the width of the dummy wordline 82 is from about 0.25 $\mu$m to about 0.35 $\mu$m. In yet another embodiment, the width of the wordlines 76 is from about 0.2 $\mu$m to about 0.3 $\mu$m and the width of the dummy wordline 82 is from about 0.2 $\mu$m to about 0.3 $\mu$m.

An example of making the SONOS type nonvolatile memory device 70 of FIG. 5 follows. The example highlights the processing in the core region only, since the dummy wordline is not formed in the periphery region. In this connection, the processing in the periphery region is not impacted by the formation of the dummy wordline.

Figure 6:
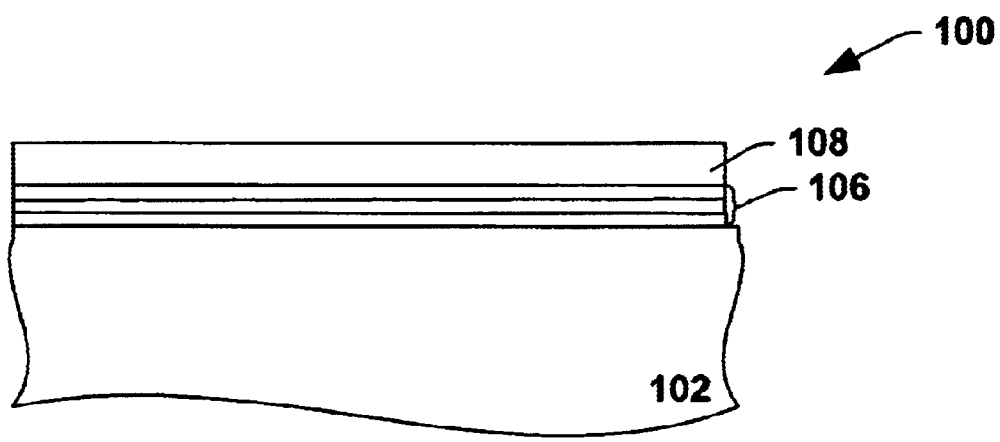
FIG. 6 illustrates a cross sectional view of making a SONOS type non-volatile semiconductor memory cell in accordance with one aspect of the present invention.

Referring to FIG. 6, a substrate 102, such as a P-type silicon substrate, is initially provided. The cross-sectional view of the substrate 102 is, in relation to FIG. 5, viewed from right to left along wordlines 76 and perpendicular to bitlines 78 at the edge of the core region 74 near the periphery region 72 of FIG. 5. An optional oxide layer (not shown) is formed over the substrate 102 using any suitable means, such as chemical vapor deposition (CVD), dry oxidation, wet oxidation or rapid thermal oxidation. Dry oxidation, wet oxidation, and rapid thermal oxidation are preferred, especially when the optional tunnel oxide layer contains silicon dioxide. CVD techniques are employed in instances where the tunnel oxide layer contains silicon dioxide or silicon oxynitride. Oxide growth may be conducted in a one step process, a two step process (two or more growth steps), a three step process and so on. In one embodiment, the thickness of the optional oxide layer is from about 30 Å to about 300 Å.

A charge trapping dielectric 106 is formed over the substrate 102 or the optional tunnel oxide layer. Although shown as a trilayer ONO dielectric, charge trapping dielectric 106 can be any dielectric capable of facilitating electron charge trapping. The charge trapping dielectric 106 is formed using any suitable means, such as one or more of CVD, dry oxidation, wet oxidation or rapid thermal oxidation. Preferably, in the embodiment, where an ONO charge trapping dielectric is employed, the first oxide layer is formed by oxide growth, the nitride layer is formed by CVD techniques, and the second oxide layer is formed by CVD techniques. In one embodiment, the total thickness of charge trapping dielectric 106, regardless of the number of sublayers, is from about 75 Å to about 300 Å.

Prior to or after forming the charge trapping dielectric 106, bitlines (not shown) may be formed in the substrate 102 by implantation. For example, one or more of arsenic, boron, and phosphorus are implanted and the structure is optionally annealed at a suitable temperature after implantation. The selection of implantation materials primarily depends on the type of substrate employed, for example, whether a p-type or n-type is used (p+, p−, n+, or n−). The implantation materials are implanted at a dosage suitable to form buried bitlines.

Although not shown, a threshold implant ($V_T$ adjustment implant) step may be conducted before or after formation of the charge trapping dielectric 106 over the structure and before or after the bitline implantation step. For example, a blanket implantation of boron may be performed just prior to forming the charge trapping dielectric 106.

Poly layer 108 is formed over the charge trapping dielectric 106. The poly layer may contain polysilicon, doped polysilicon, or doped amorphous silicon. In one embodiment, the poly layer 108 has a thickness from about 500 Å to about 5,000 Å. In another embodiment, the poly layer 108 has a thickness from about 1,000 Å to about 4,000 Å.

Figure 7:
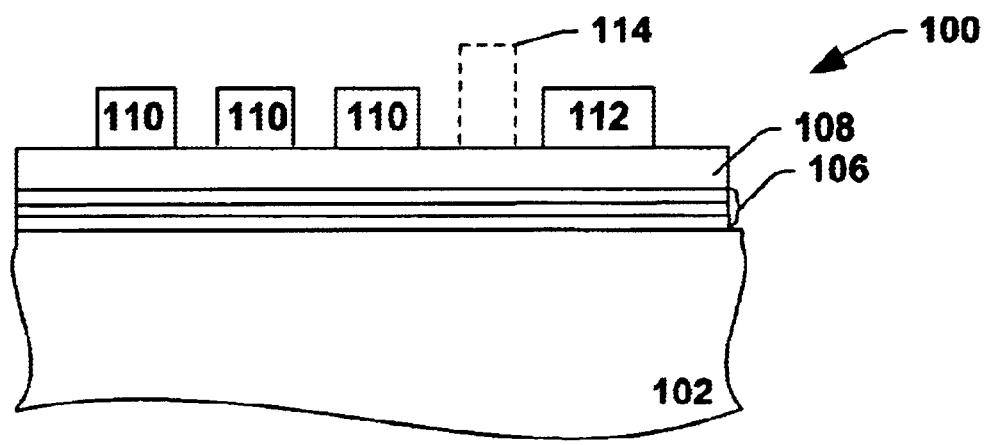
FIG. 7 illustrates a cross sectional view of a SONOS type non-volatile semiconductor memory cell in accordance with one aspect of the present invention.

Referring to FIG. 7, the poly layer 108 is patterned to form gates/wordlines including functioning wordlines 110 and dummy wordline 112. The functioning wordlines 110 have the same or approximately the same width. Dummy wordline 112 may or may not have the same width as functioning wordlines 110, and typically wordline 112 has a larger width than the functioning wordlines 110. Although not formed at this point in the processing, dashed line 114 represents subsequent formation of a bitline contact. It is noted that the dummy wordline 112 is formed near the edge of the core region and/or near a bitline contact.

Although not shown, additional layers and contacts may be formed thereover. For example, a tungsten silicide layer, a poly-cap layer, a silicon oxynitride layer, an interlevel oxide layer and/or an encapsulating layer may be formed over the structure.

In one embodiment, the erase time of a non-volatile memory cell in accordance with the present invention is less than about 500 milliseconds, and all memory cells within a given array have an erase time within 30 milliseconds of the average erase time. In another embodiment, the erase time of a non-volatile memory cell in accordance with the present invention is less than about 100 milliseconds, and all memory cells within a given array have an erase time within 20 milliseconds of the average erase time.

Figure 10:
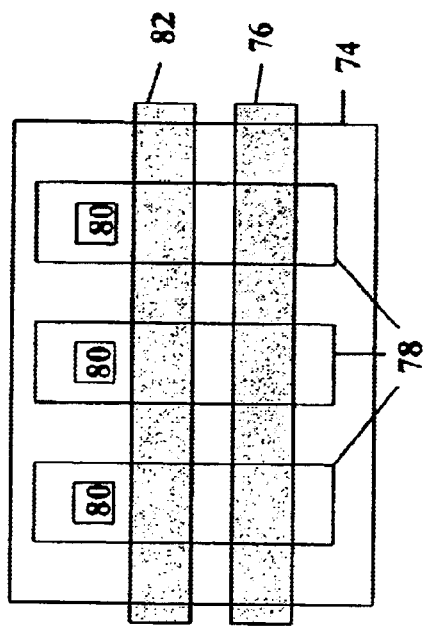
FIG. 10 illustrates a top down view of a portion of a SONOS type non-volatile semiconductor memory cell in accordance with yet another aspect of the present invention.
Figure 8:
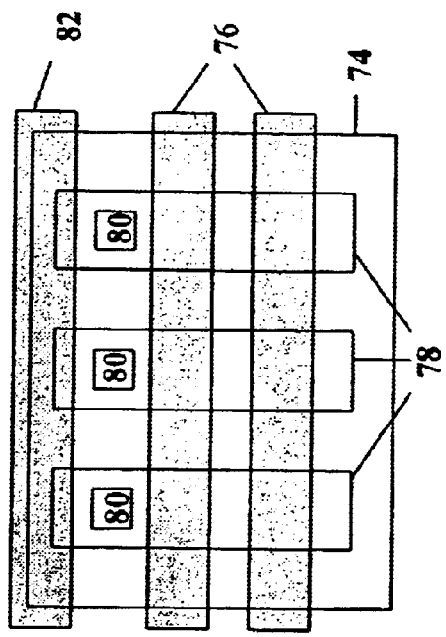
FIG. 8 illustrates a top down view of a portion of a SONOS type non-volatile semiconductor memory cell in accordance with one aspect of the present invention.
Figure 9:
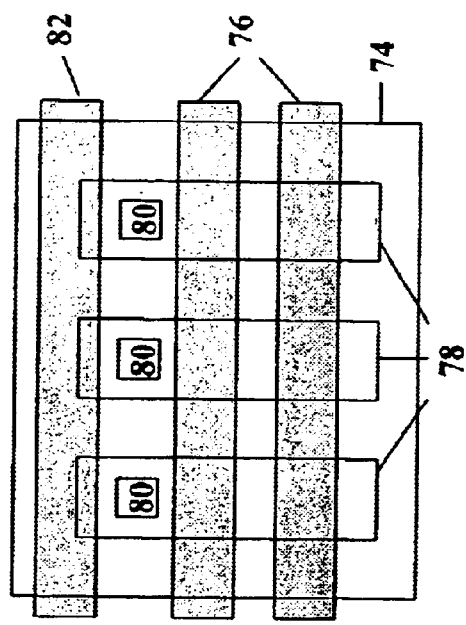
FIG. 9 illustrates a top down view of a portion of a SONOS type non-volatile semiconductor memory cell in accordance with another aspect of the present invention.
Figure 11:
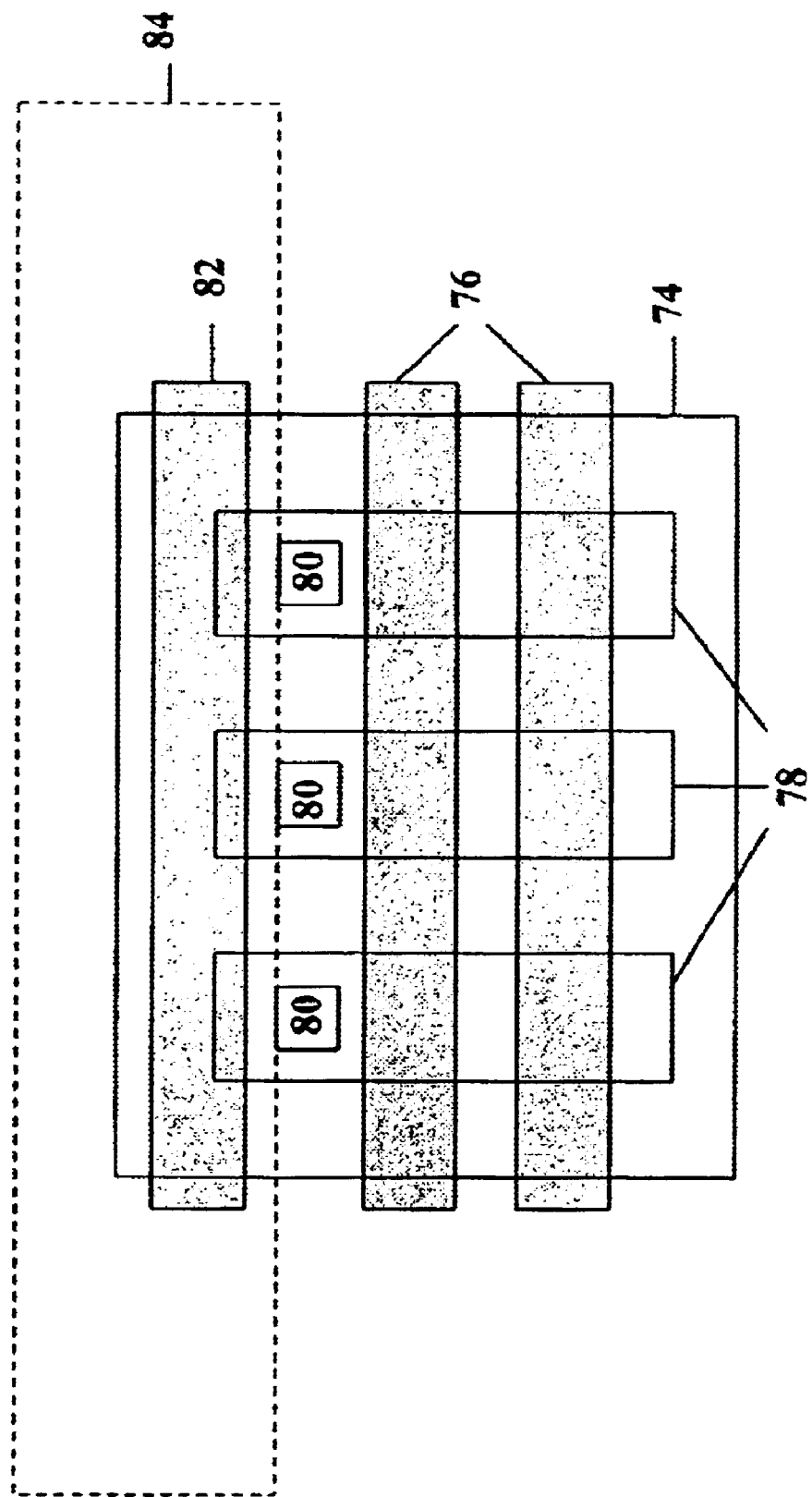
FIG. 11 illustrates a top down view of a portion of a SONOS type non-volatile semiconductor memory cell in accordance with still yet another aspect of the present invention.

Referring to FIG. 8, FIG. 9, and FIG. 10, alternative structure orientations of the dummy wordline 82 within a SONOS type nonvolatile memory device are shown in relation to wordlines 76, bitlines 78, and contacts 80. Referring to FIG. 11, the treatment area 84 is shown for the structure orientation of FIG. 9, for example. In the treatment area 84, one of implanting a threshold implant into the silicon substrate, exposing dummy gate transistors to ultraviolet light, or programming the dummy gate transistors is conducted.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A SONOS type non-volatile semiconductor memory device, comprising:
   a silicon substrate comprising a core region and periphery region, the core region comprising a plurality of memory cells and bitlines extending in a first direction;
   each of the plurality of memory cells comprising a charge trapping layer over the silicon substrate, and a polysilicon layer over the charge trapping layer; and
   wordlines extending in a second direction, the wordlines comprising functioning wordlines and at least one dummy wordline, wherein the dummy wordline is positioned near at least one of a bitline contact and an edge of the core region, and the dummy wordline is treated so as not to cycle between on and off states.

2. The memory device according to claim 1, wherein the wordlines comprise at least two dummy wordlines.

3. The memory device according to claim 1, wherein the dummy wordline has a width equal to or larger than an average width of the functioning wordlines.

4. The memory device according to claim 1, wherein the dummy wordline is one of floating, biased or grounded.

5. The memory device according to claim 1, wherein the dummy wordline is treated by one selected from the group of a local threshold implant, ultraviolet exposure of dummy gate transistors, and programming the dummy gate transistors.

6. The memory device according to claim 1, wherein the charge trapping layer comprises at least one of an ONO trilayer dielectric, an oxide/nitride bilayer dielectric, a nitride/oxide bilayer dielectric, an oxide/tantalum oxide bilayer dielectric, an oxide/tantalum oxide/oxide trilayer dielectric, an oxide/strontium titanate bilayer dielectric, an oxide/barium strontium titanate bilayer dielectric, an oxide/strontium titanate/oxide trilayer dielectric, an oxide/strontium titanate/barium strontium titanate trilayer dielectric, and an oxide/hafnium oxide/oxide trilayer dielectric.

7. A SONOS type non-volatile semiconductor memory cell having improved erase speed, comprising:
   a silicon substrate comprising a core region and periphery region, the core region comprising at least one array of memory cells and the periphery region comprising input/output circuitry;
   each of the memory cells comprising a charge trapping dielectric layer over the silicon substrate, and a polysilicon layer over the charge trapping dielectric layer;
   the core region comprising a plurality of bitlines extending in a first direction; and
   the core region comprising a plurality of wordlines extending in a second direction, the wordlines comprising functioning wordlines and at least one dummy wordline, wherein the dummy wordline is positioned between the functioning wordlines and the periphery region, and the dummy wordline is treated so as not to cycle between on and off states.

8. The SONOS type non-volatile semiconductor memory cell according to claim 7, wherein the dummy wordline is further positioned between the functioning wordlines and a bitline contact.

9. The SONOS type non-volatile semiconductor memory cell according to claim 7, wherein the dummy wordline has a width larger than an average width of the functioning wordlines.

10. The SONOS type non-volatile semiconductor memory cell according to claim 7, wherein the dummy wordline is one of floating, biased or grounded.

11. The SONOS type non-volatile semiconductor memory cell according to claim 7, wherein the dummy wordline is treated by one selected from the group of a local threshold implant, ultraviolet exposure of dummy gate transistors, and programming the dummy gate transistors.

12. The SONOS type non-volatile semiconductor memory cell according to claim 7, wherein the charge trapping dielectric layer comprises at least one of an ONO trilayer dielectric, an oxide/nitride bilayer dielectric, a nitride/oxide bilayer dielectric, an oxide/tantalum oxide bilayer dielectric, an oxide/tantalum oxide/oxide tri layer dielectric, an oxide/strontium titanate bilayer dielectric, an oxide/barium strontium titanate bilayer dielectric, an oxide/strontium titanate/oxide trilayer dielectric, an oxide/strontium titanate/barium strontium titanate trilayer dielectric, and an oxide/hafnium oxide/oxide trilayer dielectric.

13. A method of making a SONOS type non-volatile semiconductor memory device having improved erase speed, comprising:
   providing a silicon substrate having a core region and a periphery region;
   forming at least one array of memory cells in the core region, the memory cells comprising a charge trapping dielectric layer over the silicon substrate, and a polysilicon layer over the charge trapping dielectric layer;
   forming a plurality of bitlines extending in a first direction in the core region;

forming a plurality of functioning wordlines extending in a second direction in the core region;

forming at least one dummy wordline between the functioning wordlines and the periphery region or between the functioning wordlines and a bitline contact; and treating the device so that the dummy wordline does not cycle between on and off states.

14. The method according to claim 13, further comprising one of floating the dummy wordline, biasing the dummy wordline, and grounding the dummy wordline.

15. The method according to claim 13, wherein at least two dummy wordlines are formed.

16. The method according to claim 13, wherein the charge trapping dielectric layer comprises at least one of an ONO trilayer dielectric, an oxide/nitride bilayer dielectric, a nitride/oxide bilayer dielectric, an oxide/tantalum oxide bilayer dielectric, an oxide/tantalum oxide/oxide trilayer dielectric, an oxide/strontium titanate bilayer dielectric, an oxide/barium strontium titanate bilayer dielectric, an oxide/strontium titanate/oxide trilayer dielectric, an oxide/strontium titanate/barium strontium titanate trilayer dielectric, and an oxide/hafnium oxide/oxide trilayer dielectric.

17. A method of increasing erase speed in a SONOS type non-volatile memory device, comprising:

providing a silicon substrate having a core region and a periphery region, the core region comprising at least one array of memory cells, the memory cells comprising an ONO charge trapping layer over the silicon substrate, and a polysilicon layer over the ONO charge trapping layer, a plurality of bitlines extending in a first direction, a plurality of functioning wordlines extending in a second direction;

forming at least one dummy wordline between the functioning wordlines and the periphery region or between the functioning wordlines and a bitline contact and treating the device so that the dummy wordline does not cycle between on and off states.

18. The method according to claim 17, further comprising one of floating the dummy wordline, biasing the the dummy wordline, and grounding the dummy wordline.

19. The method according to claim 17, wherein the dummy wordline has a width larger than an average width of the functioning wordlines.

20. The method according to claim 17, wherein treating the device involves one selected from the group of a implanting a threshold implant into the silicon substrate near and/or below the dummy wordline, exposing dummy gate transistors to ultraviolet light to raise the threshold voltage, and programming the dummy gate transistors to remain in the on state.

\* \* \* \* \*